United States Patent [19]

Cathey et al.

[11] Patent Number: 5,537,738
[45] Date of Patent: Jul. 23, 1996

[54] METHODS OF MECHANICAL AND ELECTRICAL SUBSTRATE CONNECTION

[75] Inventors: David A. Cathey, Boise; Charles Watkins, Meridian; Derek Gochnour, Boise, all of Id.

[73] Assignee: Micron Display Technology Inc., Boise, Id.

[21] Appl. No.: 386,646

[22] Filed: Feb. 10, 1995

[51] Int. Cl.⁶ .................................................. H05K 3/36
[52] U.S. Cl. ..................... 29/830; 174/52.4; 228/179.1; 228/180.21; 437/183
[58] Field of Search ...................... 437/183; 228/180.21, 228/179.1; 174/52.4; 29/830

[56] References Cited

U.S. PATENT DOCUMENTS

| | | |
|---|---|---|
| 4,387,283 | 6/1983 | Peterson et al. . |
| 4,764,848 | 8/1988 | Simpson .................... 174/52.4 X |
| 4,857,161 | 8/1989 | Borel et al. . |
| 4,857,799 | 8/1989 | Spindt et al. . |
| 4,923,421 | 5/1990 | Brodie et al. . |
| 4,948,030 | 8/1990 | Chason et al. ............... 228/180.21 X |
| 5,014,111 | 5/1991 | Tsuda et al. .................... 228/179.1 X |
| 5,015,912 | 5/1991 | Spindt et al. . |
| 5,063,327 | 11/1991 | Brodie et al. . |
| 5,075,591 | 12/1991 | Holmberg . |
| 5,140,219 | 8/1992 | Kane . |
| 5,151,061 | 9/1992 | Sandhu . |
| 5,157,304 | 10/1992 | Kane et al. . |
| 5,246,159 | 9/1993 | Kitamura ........................... 228/179.1 |
| 5,263,246 | 11/1993 | Aoki ................................... 228/179.1 X |
| 5,381,039 | 1/1995 | Morrison . |

OTHER PUBLICATIONS

Montgomery, Clive Richard, "Flip Chip Assemblies Using Conventional Wire Bonding Apparatus and Commercially available Dies," ISHM '93 Proceedings, pp. 451–456.
"Liquid Crystal Display Products", Product Brochure, Standish LCD, Division of Standish Industries, Inc., pp. 5–6.
"Process–Stabilized Extrude Bonding Wire and Ribbon", Product Brochure, Hydrostatics Inc., Bethlehem PA, (Jun. 1991).
Kondoh, You et al. "A Subminiature CCD Module Using a New Assembly Technique", IEICE Transactions, vol. E 74, No. 8 Aug. 1991.
Cohen, I. M. et al. "Ball Formation Processes in Aluminum Bonding Wire", Solid State Technology, pp. 89–92, Dec. 1985.
Levy, F. et al. "Phosphors for Full Color Microtips Fluorescent Displays", pp. 20–23, IEEE, 1991.
Kang, Sa–Yoon et al. "Physical and Fuzzy Logic Modeling of a Flip–Chip Thermocompression Bonding Process, Journal of Electronic Packaging", pp. 63–70, Mar. 1993.
Charles, Jr., H. K. "Electronic Materials Handbook—vol. 1 Packaging", Product Brochure, ASM International.

*Primary Examiner*—Carl J. Arbes
*Attorney, Agent, or Firm*—Wells, St. John, Roberts, Gregory & Matkin

[57] ABSTRACT

The disclosure describes a method of attaching and electrically connecting first and second planar substrates, wherein the first and second substrates have inwardly-facing surfaces with matching patterns of bond pads. The method includes adjusting a wire bonder's tear length to a setting which leaves a projecting tail of severed bond wire at a terminating wedge bond connection. Further steps include making a wedge bond to an individual bond pad of the first planar substrate with bond wire from the wire bonder, and then severing the bond wire adjacent said wedge bond. The adjusted tear length of the wire bonder results in a tail of severed bond wire which projects from said wedge bond and said individual bond pad. Subsequent steps include positioning the first and second planar substrates with their inwardly facing surfaces facing each other, aligning the matching bond pad patterns of the first and second planar substrates, and pressing the first and second planar substrates against each other. The bond wire tail deforms between the bond pads of the first and second planar substrates to conductively bond therebetween.

20 Claims, 10 Drawing Sheets

_Fig. 6_

_Fig. 7_

METHODS OF MECHANICAL AND ELECTRICAL SUBSTRATE CONNECTION

TECHNICAL FIELD

This invention relates methods of attaching and electrically connecting pair of planar substrates to each other.

BACKGROUND OF THE INVENTION

The preferred embodiment of the invention includes attachment and interconnection methods which are described below in the context of a field emission flat-panel display. Such a flat-panel display is also described in two concurrently-filed applications, both assigned to Micron Display Technology, Inc., entitled "Internal Plate Flat-Panel Field Emission Display" and "Multi-Layer Electrical Interconnection Structures and Fabrication Methods," the disclosures of which are hereby incorporated by reference. The methods described and claimed herein are particularly useful in conjunction with a flat-panel display. They will also find advantageous application in the context of other circuits in which a first substrate is to be mounted face down for electrical connection between facing bond pads of the first substrate and of an underlying second substrate.

This type of connection is commonly made with flip-chip technology or bonding. Flip-chip technology forms conductive bonds between facing conductors of adjacent planar substrates. These bonds are typically formed with a small conductive "bump" which is compressed between the facing conductors, often in the presence of applied heat. Such bumps have in the past been formed with specialized equipment. More recently, they have been formed with conventional wire bonding equipment by placing a single bonding wire ball or "ball bond" on one of the surfaces which is to be bonded. This ball is subsequently compressed between conductors to form a conductive bond therebetween.

While existing flip-chip technology is useful in many situations, the techniques described above are limited to a narrow range of bumping materials. For instance, it is difficult create ball bonds with aluminum bonding wire. In contrast, the invention described and claimed below allows the use of a wide range of materials for formation of flip-chip bonds.

BRIEF DESCRIPTION OF THE DRAWINGS

FIG. 3 is an end view which shows a subassembly of the flat-panel display of FIG. 1. This subassembly includes a faceplate and an attached silicon cathode plate.

FIG. 13 is a cross-sectional view showing the backplate of FIG. 12 assembled with the subassembly of FIG. 11 in accordance with the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts." U.S. Constitution, Article 1, Section 8.

FIGS. 1–4 show components of a flat-panel field emission display 10. It is to be understood that the drawings are not to scale. They have been simplified to illustrate the novel features of the invention and its constituent parts.

Figure 1:
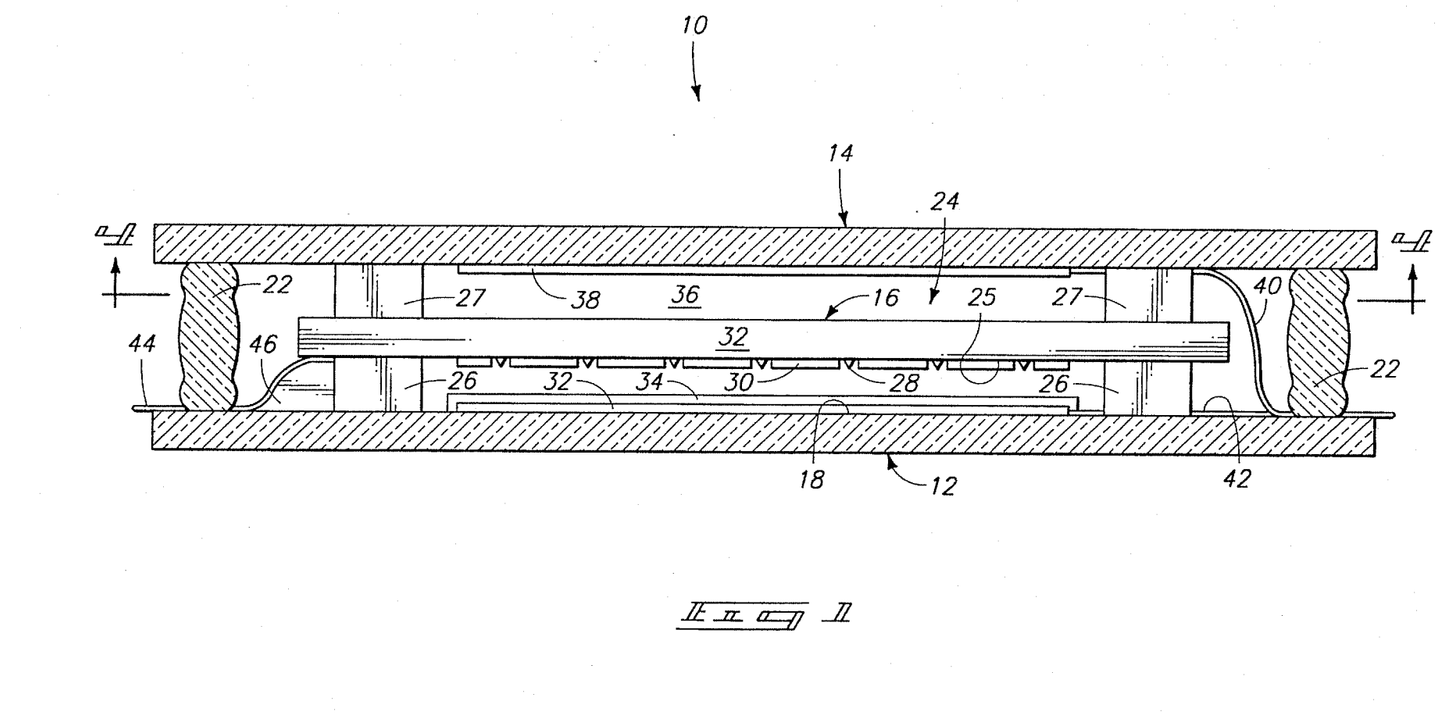
FIG. 1 is a diagrammatic sectional view of a emission effect flat-panel display.
Figure 2:
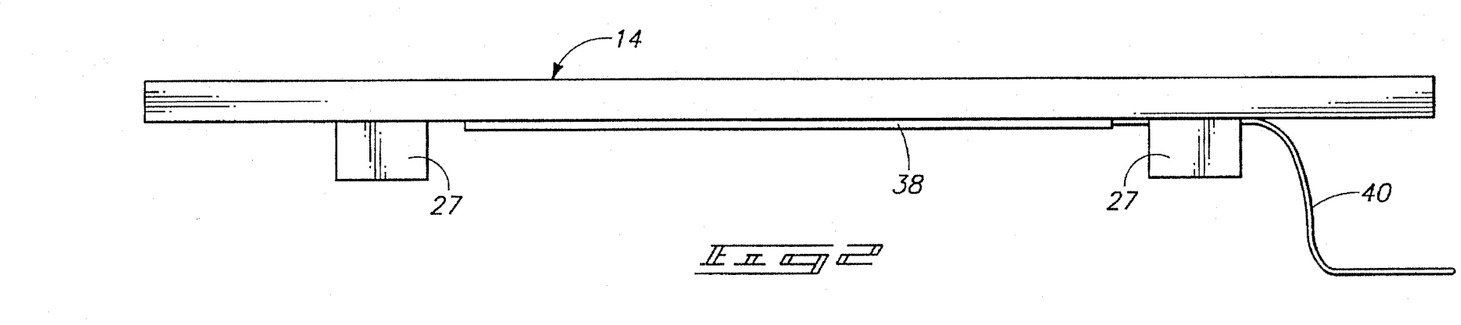
FIG. 2 is an end view which shows a subassembly of the flat-panel display of FIG. 1. The subassembly includes a backplate and rear positioning spacers.
Figure 4:
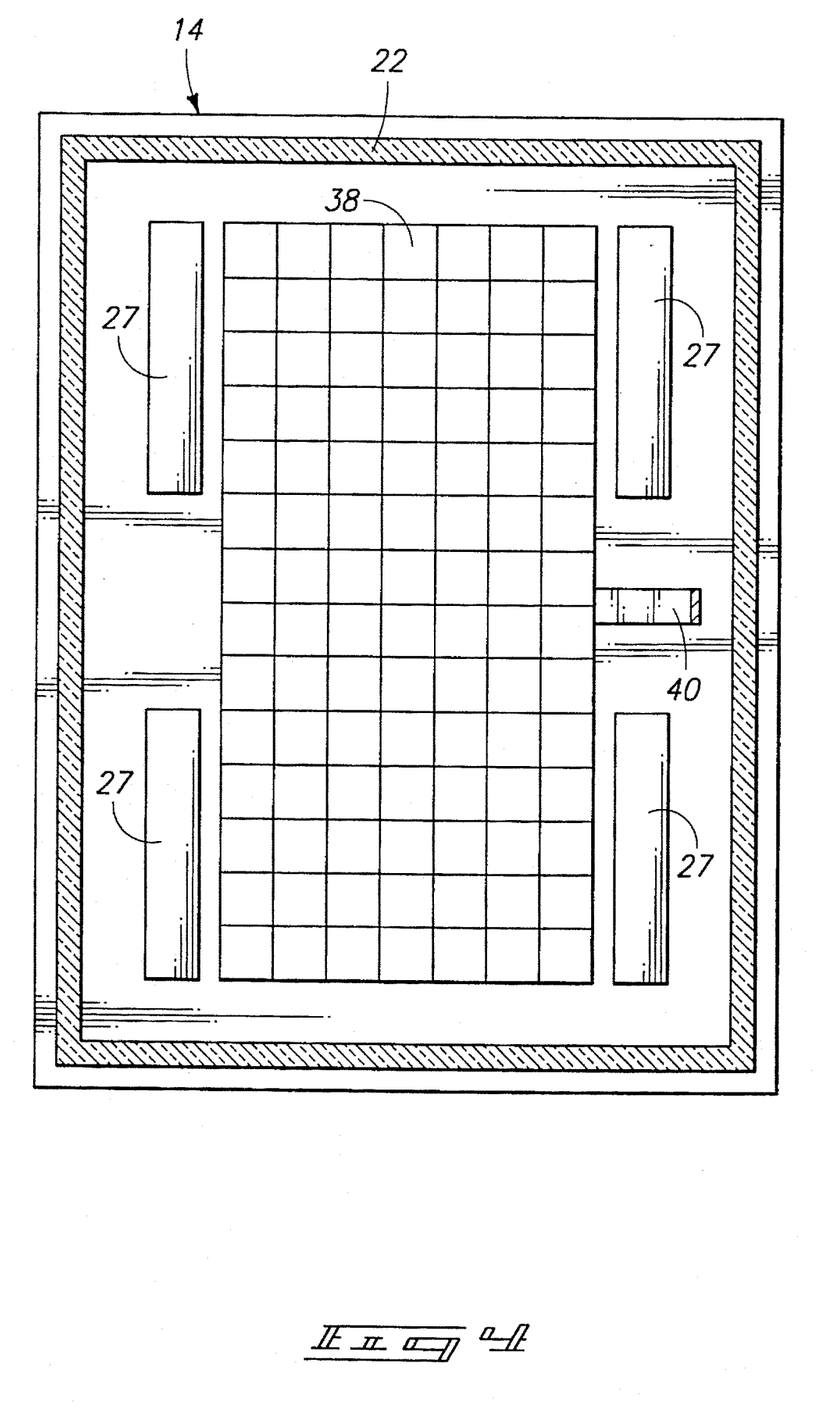
FIG. 4 is a reduced scale bottom view of the backplate shown in FIG. 2.

Flat-panel display 10 generally includes a transparent faceplate 12, a backplate 14, and a cathode plate 16 positioned between faceplate 12 and backplate 14. Faceplate 12 is made from glass to form a rigid and planar dielectric substrate to which another substrate, cathode plate 16, is mounted as described below. Faceplate 12 has an inwardly-facing rear surface 18 which is luminescent in response to impinging electrons. Backplate 14 is likewise made from glass in a rigid and planar form.

Backplate 14 is spaced rearwardly behind transparent faceplate 12 by a peripheral spacer 22 (FIG. 1). Peripheral spacer 22 extends between faceplate 12 and backplate 14 in a continuous path around the entire periphery of backplate 14 and faceplate 12. Peripheral spacer 22 also functions as a seal. Faceplate 12, backplate 14, and peripheral spacer 22 define an evacuated space 24 which contains cathode plate 16.

Cathode plate 16 is mounted to transparent faceplate 12 at a spaced distance from faceplate rear surface 18. More specifically, cathode plate 16 has a front emitter surface 25 positioned rearwardly adjacent and facing inwardly toward rear surface 18 of faceplate 12. The desired spacing between faceplate rear surface 18 and cathode plate front emitter surface 25 is established and maintained by one or more front positioning spacers 26 which are formed on rear surface 18 of faceplate 12. Front positioning spacers 26 are interposed between faceplate 12 and cathode plate 16 to space front emitter surface 25 rearwardly from faceplate rear surface 18. Cathode plate 16 is positioned behind and against front positioning spacers 26.

Cathode plate 16 comprises a semiconductor die formed of a silicon substrate. An emitter matrix is formed on front surface 25 of cathode plate 16, facing faceplate rear surface 18. The emitter matrix comprises a plurality of field emission devices formed on the front emitter surface 25 of the silicon substrate. Each field emission device is a small emitter tip, electrode, or cathode 28 surrounded by a gate structure. The gate structures of cathode plate 16 are symbolically represented in FIGS. 1 and 3, designated by the reference numeral 30. Gate structures 30 control the electron emission of electrodes 28 in response to externally-supplied control signals. The emitter tips 28 and gate structures 30 are produced on the cathode plate 16 by well-known thin film processes. Cathode plate 16 is alternatively referred to as an electrode plate or an emitter plate.

The field emitter devices included within the emitter matrix of cathode plate 16 are directed toward faceplate rear surface 18. Rear surface 18 includes a cathodoluminescent area which preferably is coated with a luminescent material, such as a phosphor coating or screen 32, and an overlying aluminum coating 34. The phosphor screen produced on the faceplate rear surface 18 is preferably aluminized. Alternatively, a transparent conductive film is applied to rear surface 18 prior to providing the phosphor coating.

The cathodoluminescent area of faceplate rear surface 18 is arranged coincidental with the operational area of the field emitter devices included in the emitter matrix of cathode plate 16. Emitter tips 28 emit electrons which are drawn toward rear surface 18 by a high differential voltage between emitter tips 28 and phosphor screen 32 in accordance with known operational characteristics of field emission displays.

Backplate 14 is spaced behind cathode plate 16 by peripheral spacer 22. In addition, one or more rear positioning spacers 27 are interposed between backplate 14 and cathode plate 16. Rear positioning spacers 27, in conjunction with front positioning spacers 26, mount cathode plate 16 at the correct position between backplate 14 and transparent faceplate 12. The spaces between backplate 14 and cathode plate 16 and between faceplate 12 and cathode plate 16 are evacuated, creating a rearward vacuum space 36 behind cathode plate 16 and a forward vacuum space 37 in front of cathode plate 16.

Flat-panel display 10 has a getter 38 positioned in rearward vacuum space 36, preferably on the forward surface of backplate 14. Getter 38 can be in the form of wires or plates of conventional getter material for chemically combining with gaseous materials produced during operation of the display. The material used to form getter 38 can be applied using any appropriate technique, including electrophoresis, screen printing, electrostatic deposition or fabrication of getter wire. If desired, getter 38 could be located on the back surface of cathode plate 16 or at other positions in the rearward vacuum space. Conductive leads 40, leading to getter 38, are sealed to the rearward surface of faceplate 12 and extend beneath peripheral seal 22, as shown in FIG. 1. This also eliminates the use of valuable silicon real estate for seal formation, thereby increasing the yield of cathode plates from single semiconductor wafers.

In general, the steps involved in producing the packaged display include attaching and electrically connecting a subassembly consisting of first and second planar substrates: faceplate 12 and cathode plate 16. Initially, faceplate 12 is prepared by forming front positioning spacers 26 on rear surface 18. Spacers 26 are preferably stenciled or screen-printed on rear surface 18 using conventional thick-film, multi-layer technology and a dielectric material such as a glass frit. The term "thick-film" is used to designate screen printing and firing processes which result in layers having thicknesses in the range of greater than five microns.

The glass frit used is preferably a devitrifying frit, which adheres to a glass substrate at its softening temperature but remelts at a higher temperature. It can be applied within the openings of a stencil (not shown) in the form of a paste produced by combining the glass frit with a solvent (such as pine oil). After applying the paste containing glass frit to faceplate rear surface 18, faceplate 12 is heated to a firing temperature to produce solid glass spacers of the desired shape and thickness, as determined by the stencil or other selected application method. The thickness of spacers 26 is selected to provide the appropriate spacing between faceplate 12 and cathode plate 16, and to maintain cathode plate 16 in a parallel relationship with faceplate 12.

Conductive leads 42, leading eventually to phosphor screen 32, are bonded to faceplate rear surface 18. In addition, a plurality of conductive traces or terminal connectors 44 are applied over rear surface 18 and one of front spacers 26 for contact with corresponding conductors of cathode plate 16. Further details and preferred alternatives regarding the connection between conductive leads 44 and the cathode plate will be set forth below. However, conductive leads 44 can be formed as shown in FIGS. 1 and 3 over a ramped spacer 46 after firing of the spacers 26 and 46, and prior to bonding cathode plate 16 to front spacers 26. Conductive leads 42 and 44 can be produced by one of many suitable techniques, including screen printing, thick film application, patterned evaporation, etc.

After applying phosphor coating 32 to rear surface 18, cathode plate 16 is bonded or attached to front spacers 26 by a suitable adhesive. The portions of conductive leads 44 which extend over front spacers 26 engage complementary pads on the active surface of cathode plate 16 to form effective electrical conductive paths to the emitter circuits. In the embodiment of FIGS. 1–4, cathode plate 16 is bonded to faceplate 12 by compressing the two components toward each other while heating them to the bonding temperature of the glass frit used to form spacers 26.

Backplate 14 is then prepared by forming rear positioning spacers 27 on rear surface 18 in a manner similar or identical to the formation of front positioning spacers 26. Spacers 26 and 27 are illustrated as identical structures in spatial registry with one another, but such identity is not essential to the present disclosure. Spacers 26 and 27 can have different sizes and relative locations about the respective backplate 14 and faceplate 12, depending upon the structural requirements and physical arrangement of a specific display. Getter 38 and conductive lead 40 are provided as described above after forming spacers 27. Alternatively, a non-evaporable getter could be used, in which no conductive lead would be required. Activation of this type of getter would occur during the high temperatures used during seal formation.

After forming rear spacers 27 and providing getter 38, peripheral spacer 22 is formed by extruding or otherwise applying a stiff glass frit paste to the front surface of backplate 14 about the intended path of peripheral spacer 22. The glass frit used for production of the peripheral seal 22 can either be a vitreous frit or a devitrifying frit. The critical physical property required in this frit is that it must vitrify at a firing temperature that is lower than the softening temperature of the frit used to form spacers 26 and 27. The frits chosen for use in producing the spacers must also have coefficients of expansion substantially matching that of the glass within backplate 14 and faceplate 12.

Backplate 14 is next moved into a position behind cathode plate 16. Bonding pressure is then applied to urge backplate 14 and faceplate 12 toward one another and intervening cathode plate 16 while heating the assembly to the firing temperature of the glass frit used to form peripheral spacer 22. This step normally takes place within a vacuum chamber maintained at the intended interior vacuum pressure for the display, but vacuum pressure could be subsequently achieved within the display by access through a sealable tube or other opening leading through the fired seal structure.

Depending upon the nature of the getter 38, it might be activated by the application of heat required to fire the peripheral spacer 22. It also might be activated by heat generated by application of electrical current through conductive leads 40 after assembly has been completed or by RF energy.

Firing of the glass frit within the peripheral spacer 22 does not affect the previously-formed bonds at the respective ends of front spacers 26, since spacers 26 will not be heated to their softening temperature. Thus, the critical spacing between faceplate 12 and cathode plate 16 can be maintained during the formation of the glass peripheral spacer 22.

No bond is required between rear spacers 27 and the backside of cathode plate 16, since the purpose of spacers 27 is simply to locate backplate 14 and cathode plate 16 in spaced parallel positions at a distance that is not critical to display operation.

Figure 5:
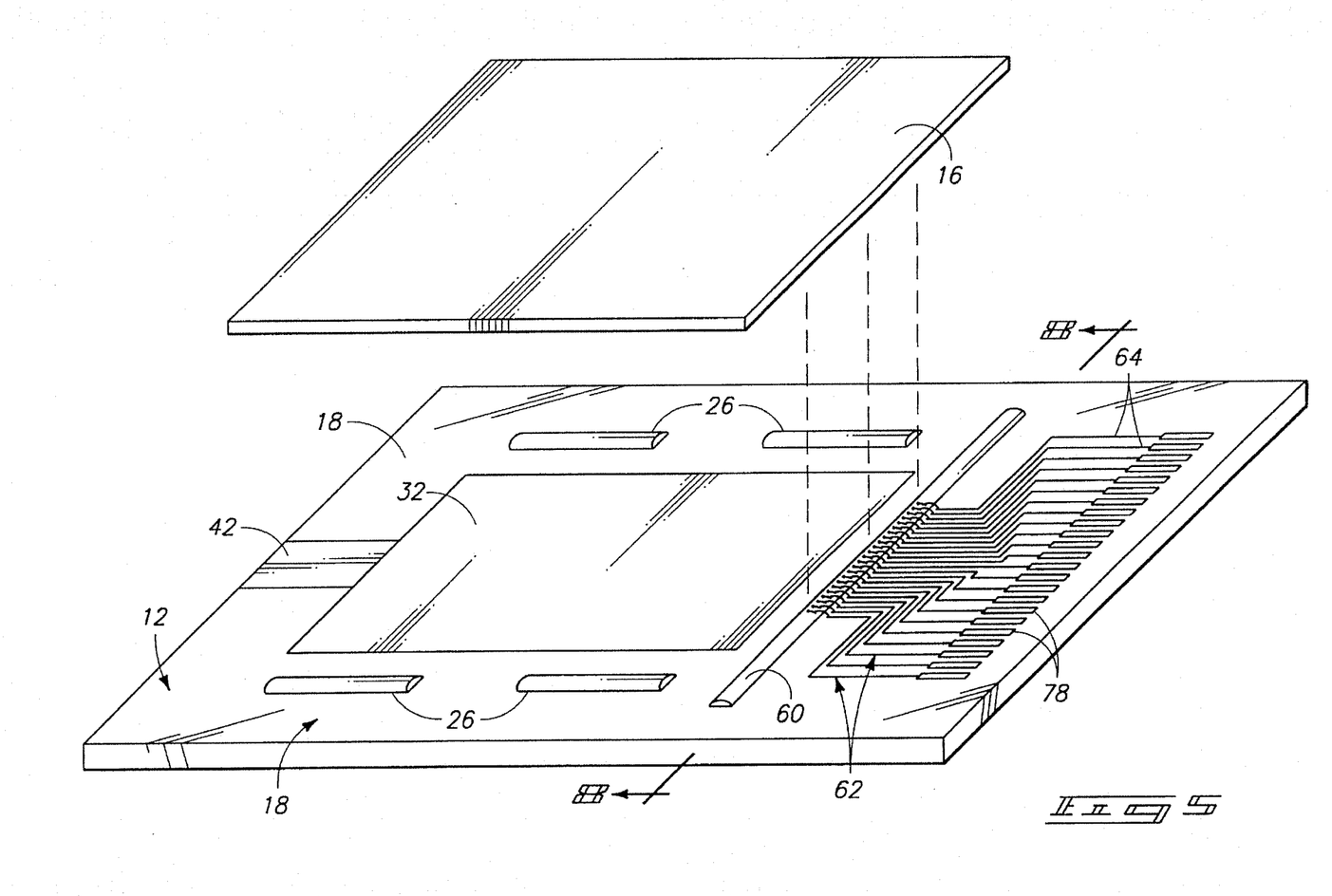
FIG. 5 is a simplified exploded perspective view of a subassembly in accordance with the invention which includes a faceplate and a silicon cathode plate.

FIGS. 5–8 show more specific details regarding preferable techniques for forming mechanical and electrical connections between the cathode plate and the faceplate, and for spacing the cathode plate from the faceplate. FIG. 5 shows cathode plate 16 positioned over transparent faceplate 12 prior to bonding the two elements. Faceplate 12 includes phosphor screen 32, a conductive lead 42, and a plurality of front positioning spacers 26 as discussed above. In addition, faceplate 16 includes an elevated connector ridge 60 and a plurality of faceplate terminal conductors 62 overlying faceplate rear surface 18.

Connector ridge 60 is an elongated platform formed along faceplate rear surface 18 by conventional thick film stenciling or screen printing techniques with a dielectric material such as a devitrifying frit. It is preferably formed simultaneously with forming front positioning spacers 26. However, positioning spacers 26 have greater thicknesses than connector ridge 60. Specifically, connector ridge 60 is formed with a thickness of about one mil less than that of positioning spacers 26. Typically, the positioning spacers will have a thickness of about eight mils and the connector ridge will have a thickness of about seven mils.

Figure 6:
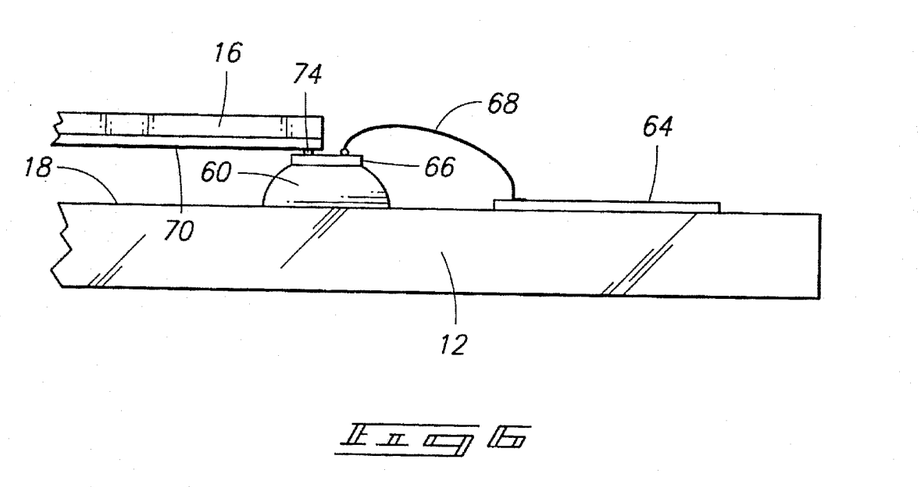
FIG. 6 is a partial cross-sectional view of the subassembly shown in FIG. 5, showing a faceplate connector ridge and associated connection circuitry. The faceplate and cathode plate are shown in their assembled positions.

Faceplate terminal conductors 62 are conductive metal traces having portions which extend over connector ridge 60. Terminal conductors 62 thus have base portions 64 and connecting portions 66 (FIG. 6). Base portions 64 are positioned directly over faceplate rear surface 18 while connecting portions 66 are positioned atop and overly connector ridge 60. Connecting portions 66 form bond pads over faceplate rear surface 18. Terminal conductors 62 are formed by screen-printing, using conventional thick-film multi-layer technology. There is a gap between base portions 64 and connecting portions 66, necessitated by the difficulty or impracticality of screen printing over the abrupt elevational change presented by connecting ridge 60. However, the base and connecting portions of individual conductive traces are electrically connected to each other by a plurality of bond wire interconnections 68. Each bond wire interconnection 68 is a length of bond wire which extends between a base portion 64 and its corresponding connecting portion 66. Each bond wire interconnection 68 is connected and anchored at each of its respective ends by a ball bond or wedge bond. Conventional wire bonding equipment is used to create the bond wire interconnections.

This type of connection is a distinct improvement over prior art technology, such as "via" technology, for connecting between different levels of a multi-layer circuit. It is especially advantageous in the environment described above, in which a substrate is to be mounted, face down, over elevated conductors which must, in turn, be connected to conductors at a lower level.

Faceplate 12 and cathode plate 16 have inwardly-facing surfaces with matching patterns of bond pads. Specifically, cathode plate 16 has a plurality or pattern of die bond pads 72 on or adjacent an outer edge of front emitter surface 25. The bond pad pattern of faceplate 12 is formed by connecting portions 66 of faceplate terminal conductors 62, over faceplate rear surface 18.

Cathode plate 16 has a plurality of emitter or electrode conductors 70 on or adjacent its front emitter surface 25. These conductors are electrically connected to individual emitters or electrodes of cathode plate 16. In most cases, the electrical connection between the conductors and the emitters will be through multiplexing circuitry (not shown) on cathode plate 16. Each emitter conductor 70 terminates in one of die bond pads 72.

Cathode plate 16 is positioned over connector ridge 60 for electrical contact between cathode plate 16 and connecting portions 66 of terminal conductors 62. Bond pads 72 are aligned with connecting portions 66.

A plurality of conductive metal bonds are formed by deformable metal bumps 74 which are interposed between faceplate rear surface 18 and cathode plate 16. The metal bumps form individual electrical connections between faceplate 12 and cathode plate 16. Metal bumps 74 are formed in accordance with conventional bumping techniques between terminal conductor connecting portions 66 and cathode plate bond pads 72. Cathode plate 16 is pressed against faceplate 12 to smash metal bumps 74 and to thereby form the conductive bonds. Metal bumps 74 also form physical bonds when used in this manner. This process, used in other applications within the semiconductor industry, is referred to as flip-chip technology. The conductive and physical bonds described above are therefore alternatively referred to as conductive flip-chip bonds. Heat is sometimes used in conjunction with pressure to form the bonds. Flip-chip technology also includes precision alignment equipment which is advantageously used to align bond pads 72 with terminal conductors 62 and to align emitter tips on cathode plate 16 with appropriate phosphor pixels on faceplate 12 before cathode plate 16 is pressed against faceplate 12. Two or more alignment dots are printed on each of cathode plate 16 and faceplate 12 to facilitate this process in accordance with conventional flip-chip techniques.

The invention thus includes a number of unique methodical steps which result in the structure described above. Such steps include mounting cathode plate 16 to luminescent faceplate 12 at a spaced distance from faceplate rear surface 18 and subsequently affixing backplate 14 to faceplate 12 behind cathode plate 16. Further steps include spacing backplate 14 rearward from faceplate 12 to create an internal space between backplate 14 and faceplate 12. The internal space contains the cathode plate and creates a rearward vacuum space behind cathode plate 16. The invention also includes providing a getter in the rearward vacuum space and, finally, evacuating the internal space between the backplate and luminescent faceplate.

Mounting cathode plate 16 to faceplate 12 is accomplished through the flip-chip or metal bumping technology described above. Preferable steps include forming front positioning spacers 26 on faceplate rear surface 18 and simultaneously forming one or more connector ridges 60 on faceplate rear surface 18. Further steps include screen printing a plurality of conductive traces, referred to herein as faceplate terminal conductors 62, overlying faceplate rear surface 18 and extending over connector ridge 60. The terminal conductors have base portions 64 and connecting portions 66 which are electrically connected by wire bonding the base portions of individual conductive traces to their corresponding connecting portions.

Conductive bonds between terminal conductors 62 and emitter conductors 70 are formed by providing metal bumps 74 between connecting portions 66 and cathode plate bond pads 72 prior to pressing cathode plate 16 against faceplate 12. Metal bumps 74 can be formed on either connecting portions 66 or bond pads 72. The metal bumps form the conductive bonds between the cathode plate bond pads and the terminal conductors as a result of pressing the cathode plate against the faceplate.

The conductive metal bonds form individual electrical connections between the terminal conductors and the cathode plate, as well as forming physical adhesion connections or bonds between the faceplate and cathode plate to mount the cathode plate to the faceplate. This eliminates the need for heating spacers 26 to their melting point during assembly. The conductive bonds provide both mechanical and electrical connections between faceplate 12 and cathode plate 16.

Faceplate terminal conductors 62 extend outward on rear surface 18, beneath and beyond the peripheral spacer 22 discussed with reference to FIGS. 1–4, to external connector pads 78 (FIG. 5). These pads are accessible outside of the evacuated internal space of the flat-panel display. Being electrically connected to the emitter conductors of the cathode plate, they provide convenient points of electrical connection between the cathode plate and external driver circuitry.

Figure 9:
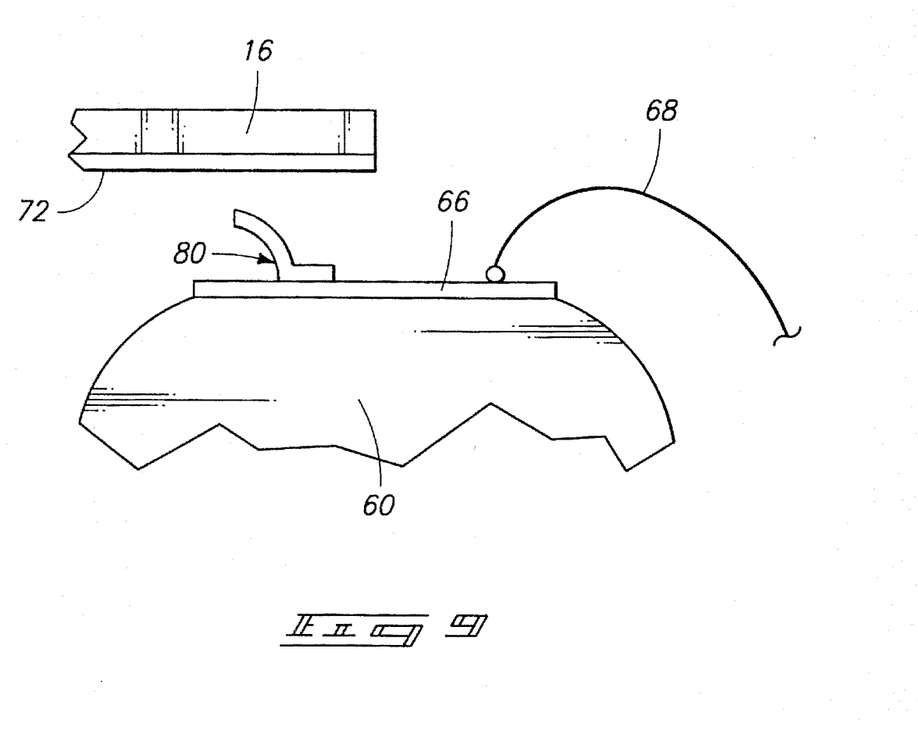
FIG. 9 is an enlarged cross-sectional view similar to FIG. 6, illustrating an improved method of providing electrical connections between a faceplate and a cathode plate. The faceplate and cathode plate are shown in positions prior to assembly.
Figure 10:
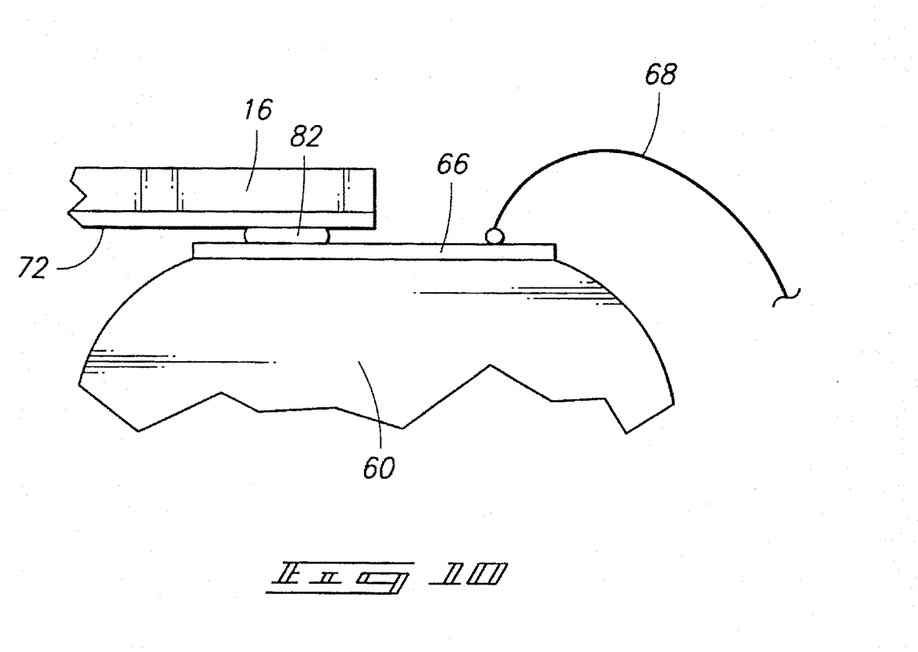
FIG. 10 is an enlarged cross-sectional view such as shown in FIG. 9, except that the faceplate and cathode plate are shown after assembly.

FIGS. 9 and 10 show an alternative and preferred method which is used to create flip-chip connections or bonds between the faceplate and the cathode plate. The alternative method utilizes a conventional wire bonder or wire bonding machine such as the one used to create wire bond interconnections 68. Generally, the method comprises bonding stubs of bond wire, with wedge bonds, either to connecting portions 66 of terminal connectors 62 or to the bond pads 72 of cathode plate 16. The bond wire stubs have projecting tails of bond wire which are interposed between and bonded to terminal connectors 62 and to bond pads 72 to form conductive flip-chip bonds therebetween.

More specifically, the alternative method comprises adjusting a wire bonder's tear length to a setting which leaves a projecting tail of severed bond wire at terminating wire bond connections. The projecting tail is preferably about two microns in length. Subsequent steps include making wedge bonds to connecting portions or bond pads 66 of individual terminal conductors 62 with bond wire from the wire bonder. Such bonds could alternatively be made to cathode plate bond pads 72. Further preferred steps include abbreviating the wire bond connections by severing the bond wire adjacent the wedge bonds. The adjusted tear length of the wire bonder results in tails or stubs 80 of severed bond wire which project from the individual wedge bonds and the individual bond pads.

Further preferred steps include positioning faceplate 12 and cathode plate 16 with their inwardly-facing surfaces, corresponding to faceplate rear surface 18 and front emitter surface 25, facing each other. The preferred methods subsequently involve aligning the matching bond pad patterns of faceplate 12 and cathode plate 16 with each other. Specifically, cathode plate bond pads 72 are aligned with connecting portions 66 of terminal connectors 62. After this alignment, bond wire tails 80 are interposed directly between cathode plate bond pads 72 and connecting portions or bond pads 66 of terminal connectors 62. The two substrates, cathode plate 16 and faceplate 12, are then mated by pressing them against each other. Bond wire tails 80, as a result, deform between the connecting regions and bond pads of cathode plate 16 and faceplate 12 to conductively bond therebetween.

The steps described above, of making a wedge bond and of severing the bond wire adjacent said wedge bond, are performed in successive repetitions before pressing cathode plate 16 to faceplate 12, thus creating flip-chip bonds between each of the bond pads of cathode plate 16 and faceplate 12.

Bonding wire stubs 80 can be formed as described above with a Model 1470 wire bonding machine, made by Kulicke and Soffa Inc., of Willow Grove, Pa. Aluminum wire is preferably used. Such wire preferably has a diameter of about 0.00125 inches, with approximately 1% silicon. The ability to use aluminum or other types of bonding wire is a definite advantage over prior art methods of providing conductive bonds between facing conductors. Such prior art methods generally required using gold.

It has been found that forming the abbreviated wedge bond connections described above result in compression and deformation of bonding wire within the bonding wedge of the wire bonding equipment. While this is a normal occurrence, the deformation is not allowed to clear the bonder wedge during repeated abbreviated connections because of the unusually short length of bonding wire which is allowed to pass through the wedge at each connection. Each subsequent abbreviated connection aggravates and compounds the deformation, until the wire eventually sticks or jams within the bonder wedge. This anomaly is solved in the preferred embodiment by interposing each successive repetition of making a wedge bond and of severing the bond wire adjacent said wedge bond by a step of interconnecting between spaced individual conductors with wire from the wire bonder. In other words, a normal point-to-point wire bond connection is completed after each abbreviated connection. In the preferred embodiment described above, the wire bonder is programmed to alternate between forming individual bonded stubs or tails 80 and individual wire bond interconnections 68.

Figure 11:
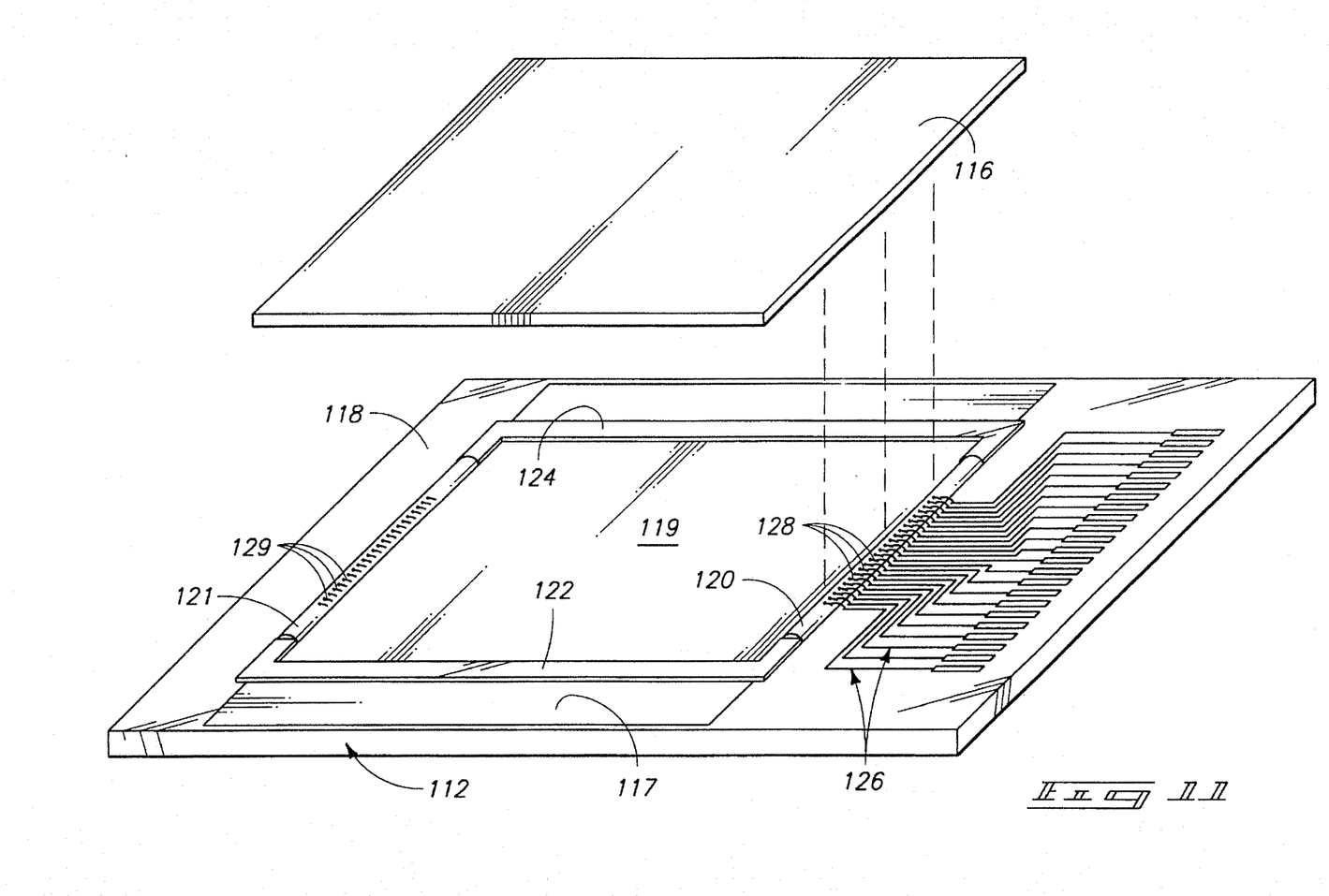
FIG. 11 is a simplified exploded perspective view of an alternative embodiment subassembly which includes a faceplate and a silicon cathode plate.
Figure 12:
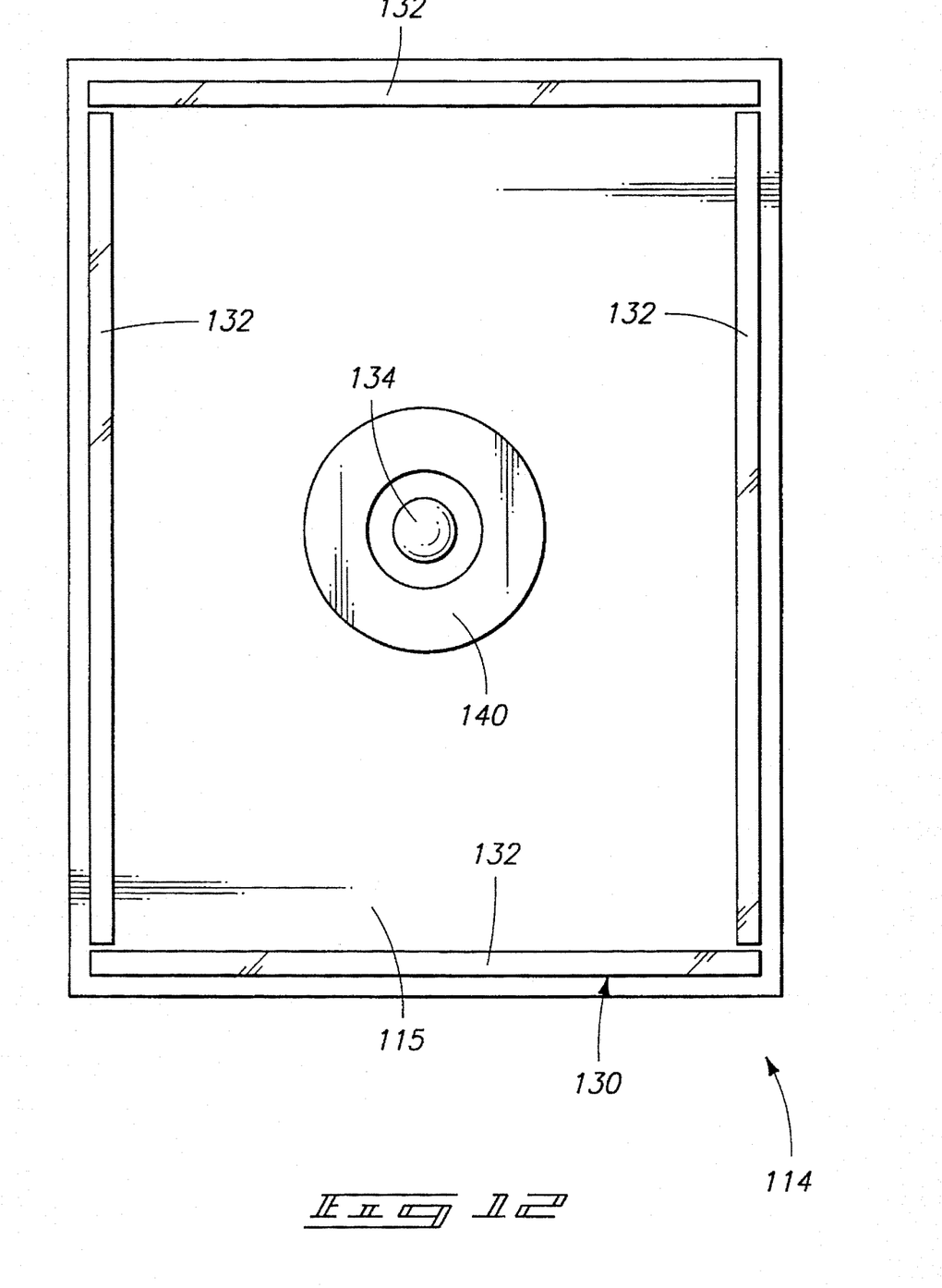
FIG. 12 is a view of the front surface of a backplate to be used in conjunction with the subassembly shown in FIG. 11.

FIGS. 11–13 show components of an alternative flat-panel field emission display. The flat-panel display generally includes a transparent faceplate 112, a backplate 114 (FIG. 13), and a cathode plate 116 positioned between faceplate 112 and backplate 114. These components are the same as those discussed above except as otherwise noted. Backplate 114 is made from glass in a rigid and planar form. It has a front surface 115. Cathode plate 116 is formed from a silicon substrate. It has an emitter matrix (not shown) formed on a front surface 125.

Faceplate 112 is made from glass in a rigid and planar form. It has a rear surface 118. Rear surface 118 has a cathodoluminescent area 119 which is coated with phosphor. Underlying the phosphor is a conductive layer 117 of transparent material such as indium oxide, tin oxide, or indium tin oxide (layers 117 and 119 are shown only in FIG. 11). This conductive layer can extend beyond cathodoluminescent area 119, but must be patterned so that it does not underlie subsequently applied conductors.

Faceplate 112 is prepared for mating with cathode plate 116 by forming a pair of elevated connector ridges 120 and 121 on rear surface 118. Each connector ridge is an elevated platform formed by conventional thick film stenciling or screen printing techniques with a dielectric material. The ridges are preferably polished after their initial formation to leave a relatively flat surface on their peaks.

In the preferred embodiment, connector ridges 120 and 121 are about ten thousandths of an inch high after polishing. They are formed of a devitrifying glass frit which has a relatively high melting or softening point after firing, so that they are not affected by subsequent processing steps. Connector ridges 120 and 121 could alternatively be integrally formed with faceplate 112 by molding or extrusion.

Outlining strips 122 and 124 are formed over conductive layer 117 along lines corresponding in position to the eventual position of the outer periphery of cathode plate 116. These strips are formed by stenciling and firing the same material used to form connector ridges 120 and 121. However, they have a height which is significantly less than connector ridges 120 and 121. Specifically, outlining strips 122 and 124 are about one thousandth of an inch thick and about 0.020 inches or more wide. The purpose of these strips is to reduce or eliminate electron emissions from the sharp peripheral edges of cathode plate 116 toward conductive layer 117.

A plurality of faceplate terminal conductors 126 are formed to overlie faceplate rear surface 118. Conductors 126 are formed as already described with reference to FIG. 6. Faceplate terminal conductors 122 have portions which extend over at least one of connector ridges 120 and 121. In the embodiment shown, terminal conductors 122 have connecting portions 128 which extend over connector ridge 120.

Distinct from the terminal conductors 126, faceplate 112 has a set of connecting portions 129 which lie atop connector ridge 121. These connecting portions are present only for purposes of physically bonding cathode plate 116 to faceplate 112, and not necessarily for electrical connections. Connecting portions 129 correspond generally in size and spacing to connecting portions 128 of terminal conductors 126.

Figure 7:
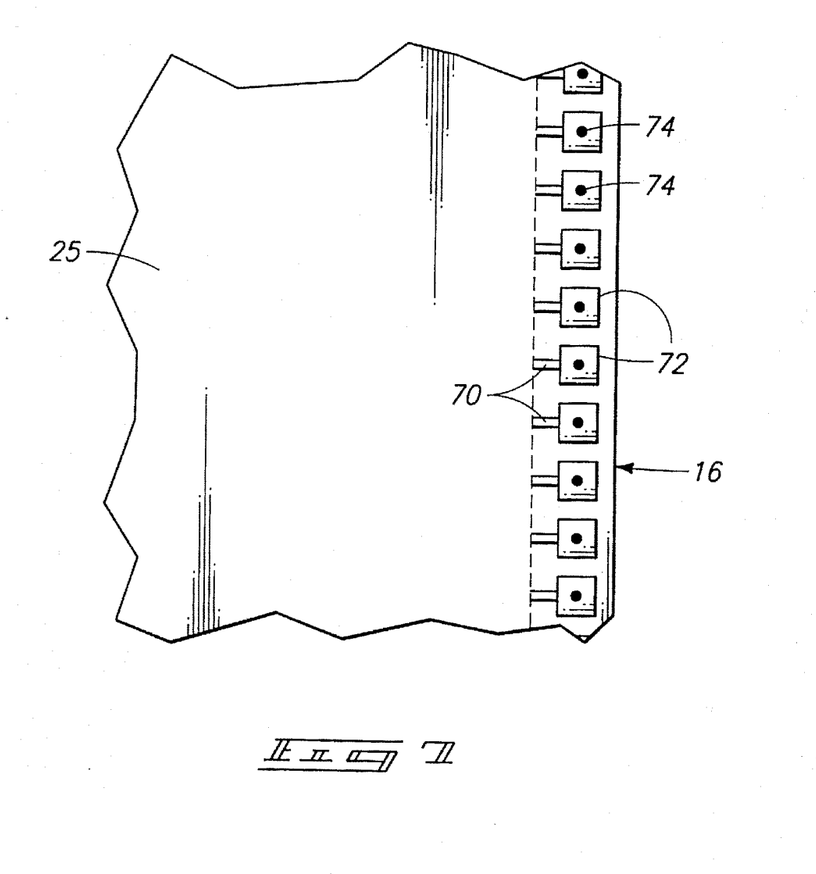
FIG. 7 is a partial front view of the cathode plate shown in FIG. 5.
Figure 8:
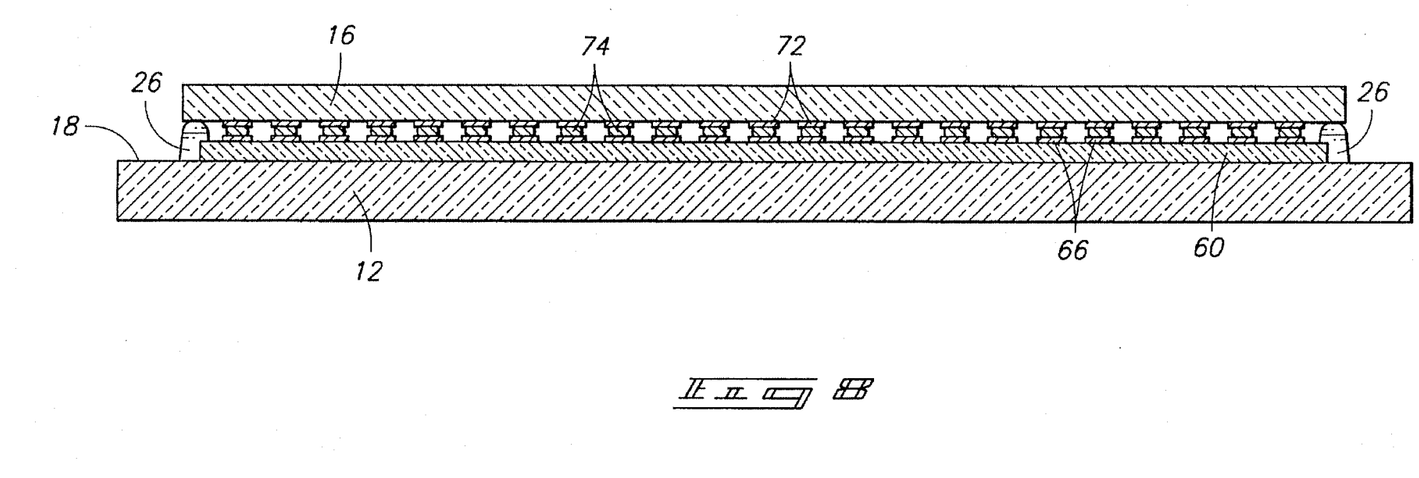
FIG. 8 is a sectional end view of the cathode plate and faceplate of FIG. 5, taken along the line 8—8 of FIG. 5. The faceplate and cathode plate are shown in their assembled positions.

Cathode plate 116 has bond pads as shown in FIG. 7 corresponding to connecting portions 128 of conductors 126. These bond pads connect to emitters and associated circuitry on cathode plate 116. Cathode plate 116 has a similar set of bond pads corresponding to connecting portions 129. Again, these bond pads are for subsequent physical bonding, and not for any necessary electrical connections.

Cathode plate 116 is bonded to faceplate 112 with flip-chip connections between the bond pads of cathode plate 116 and connecting portions 128 and 129. The flip-chip connections are implemented as already shown and described with reference to FIGS. 9 and 10.

This bonding of cathode plate 116 to faceplate 112 differs from the embodiment of FIGS. 5–8 primarily in that no separately-formed front positioning spacers are used. It has been found that connecting ridges 120 and 121 provide sufficient support to act as positioning spacers and to eliminate the need for further front spacers. The connecting ridges themselves establish the desired spacing between the faceplate and the cathode plate. This is possible, at least in part, because of the unique arrangement of faceplate, cathode plate, and backplate, in which the cathode plate is not subject to any differential pressure between its front and rear surfaces.

Backplate 114 is prepared by forming a rear peripheral positioning spacer 130 on front surface 115 (FIG. 12). Spacer 130 is sized and positioned to extend along the peripheral edges of backplate 114, and to completely surround cathode plate 116. Rear positioning spacer 130 is formed by bonding four thin glass strips 132 in a rectangular shape to the front surface 115 of backplate 114. Glass strips 132 preferably have cross-wise dimensions of about 0.040 inches by 0.1 inches. They are bonded to front surface 115 by a fired high temperature frit—preferably the same frit used to form connector ridges 120 and 121. This frit is also applied at the abutments of the strips to fill any gaps.

A peripheral seal is then formed in combination with glass strips 132 by applying a devitrifying or vitreous glass sealing frit (not shown) which adheres to the glass strips. This frit should have a softening temperature which is no greater than the vitrifying temperature of the frit used to form connector ridges 120 and 121. The frit is commonly applied as a paste. A bead or lump 134 of such paste is also applied to the central portion of front surface 115, within the area bounded by glass strips 132. Backplate 114 is then glazed in order to solidify the sealing frit and frit bead 134. This causes the frit to adhere to the underlying glass and to solidify, but does not cause the frit to fuse.

Evaporable getter material 140 is then applied or positioned around frit bead 134. In the embodiment shown, the getter material is in the form of a flat ring which surrounds frit bead 134.

Backplate 114 and the subassembly comprising faceplate 112 and cathode plate 116 are then bonded to each other. This bonding takes place in a vacuum chamber at the intended interior vacuum pressure for the display. The sealing frit material of backplate 114 is pressed against the periphery of the faceplate's rear surface 118, and the components are heated to first soften and then to vitrify the sealing frit and frit bead 134. The getter behind cathode plate 116 is activated during this process by the applied heat. This process results in the assembled structure of FIG. 13, in which cathode plate 116 is contained within an evacuated chamber bounded by glass strips 132, faceplate 112, and backplate 114. Frit bead 134 acts as a back spacer or support for cathode plate 116. The faceplate, backplate, and peripheral seal thus define an evacuated space which contains the cathode plate.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of attaching and electrically connecting first and second planar substrates, the first and second planar substrates having inwardly-facing surfaces with matching patterns of bond pads, the method comprising:

adjusting a wire bonder's tear length to a setting which leaves a projecting tail of severed bond wire at a terminating wedge bond connection;

making a wedge bond to an individual bond pad of the first planar substrate with bond wire from the wire bonder;

severing the bond wire adjacent said wedge bond, the adjusted tear length of the wire bonder resulting in a tail of severed bond wire which projects from said wedge bond and said individual bond pad;

positioning the first and second planar substrates with their inwardly-facing surfaces facing each other;

aligning the matching bond pad patterns of the first and second planar substrates, the bond wire tail being interposed between the bond pads of the first and second planar substrates; and pressing the first and second planar substrates against each other, the bond wire tail deforming between the bond pads of the first and second planar substrates to conductively bond therebetween.

2. A method as recited in claim 1 and further comprising:

performing successive repetitions of making a wedge bond and of severing the bond wire adjacent said wedge bond; and said successive repetitions being performed prior to the step of pressing the first and second planar substrates against each other.

3. A method as recited in claim 1 and further comprising:

performing successive repetitions of making a wedge bond and of severing the bond wire adjacent said wedge bond;

said successive repetitions being performed prior to the step of pressing the first and second planar substrates against each other;

each of said successive repetitions being interposed by a step of interconnecting between spaced individual conductors with wire from the wire bonder.

4. A method as recited in claim 1 and further comprising using aluminum alloy wire in the wire bonder.

5. A method as recited in claim 1 wherein one of the planar substrates is a semiconductor die.

6. A method as recited in claim 1 wherein the first planar substrate is a semiconductor die.

7. A method as recited in claim 1 wherein the second planar substrate is a semiconductor die.

8. A method as recited in claim 1 and further comprising applying heat during the pressing step to bond between the first and second planar substrates.

9. A method as recited in claim 1 and further comprising applying vibration during the pressing step to bond between the first and second planar substrates.

10. A method as recited in claim 1 wherein the tear length is adjusted to a length of about 2 microns.

11. A method as recited in claim 1 and being void of any separate adhesive interconnect between the bond pads of the first and second planar substrates.

12. A method of attaching and electrically connecting first and second planar substrates, the first and second planar substrates having inwardly-facing surfaces with matching patterns of bond pads, the method comprising:

adjusting a wire bonder's tear length to a setting which leaves a projecting tail of severed bond wire at a terminating wedge bond connection;

making a wedge bond to an individual bond pad of the first planar substrate with bond wire from the wire bonder;

severing the bond wire adjacent said wedge bond, the adjusted tear length of the wire bonder resulting in a tail of severed bond wire which projects from said wedge bond and said individual bond pad, the tail having an outermost end which is displaced from both the bond pad and the wedge bond;

positioning the first and second planar substrates with their inwardly-facing surfaces facing each other;

aligning the matching bond pad patterns of the first and second planar substrates, the bond wire tail being interposed between the bond pads of the first and second planar substrates; and pressing the first and second planar substrates against each other, the bond wire tail deforming between the bond pads of the first and second planar substrates to conductively bond therebetween.

13. A method as recited in claim 12 and further comprising:

performing successive repetitions of making a wedge bond and of severing the bond wire adjacent said wedge bond; and said successive repetitions being performed prior to the step of pressing the first and second planar substrates against each other.

14. A method as recited in claim 12 and further comprising:

performing successive repetitions of making a wedge bond and of severing the bond wire adjacent said wedge bond;

said successive repetitions being performed prior to the step of pressing the first and second planar substrates against each other;

each of said successive repetitions being interposed by a step of interconnecting between spaced individual conductors with wire from the wire bonder.

15. A method as recited in claim 12 and further comprising using aluminum alloy wire in the wire bonder.

16. A method as recited in claim 12 wherein one of the planar substrates is a semiconductor die.

17. A method as recited in claim 12 wherein the first planar substrate is a semiconductor die.

18. A method as recited in claim 12 wherein the second planar substrate is a semiconductor die.

19. A method as recited in claim 12 and further comprising applying heat during the pressing step to bond between the first and second planar substrates.

20. A method as recited in claim 12 and further comprising applying vibration during the pressing step to bond between the first and second planar substrates.

* * * * *